United States Patent
Jang et al.

(10) Patent No.: US 8,042,404 B2
(45) Date of Patent: Oct. 25, 2011

(54) STRESS DETECTION CIRCUIT AND SEMICONDUCTOR CHIP INCLUDING SAME

(75) Inventors: Young-Chan Jang, Yongin-si (KR); Jung-Bae Lee, Yongin-si (KR); Yun-Sang Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 521 days.

(21) Appl. No.: 12/128,159

(22) Filed: May 28, 2008

(65) Prior Publication Data

US 2008/0295605 A1 Dec. 4, 2008

(30) Foreign Application Priority Data

May 31, 2007 (KR) .................. 10-2007-0053583

(51) Int. Cl.
*G01L 1/00* (2006.01)
(52) U.S. Cl. .......................................................... 73/777
(58) Field of Classification Search ............... 73/777, 73/778
See application file for complete search history.

(56) References Cited

U.S. PATENT DOCUMENTS

| | | | | |
|---|---|---|---|---|
| 3,558,866 A | * | 1/1971 | Poulson | 702/42 |
| 5,367,491 A | * | 11/1994 | Han et al. | 365/201 |
| 5,381,373 A | * | 1/1995 | Ohsawa | 365/201 |
| 5,654,925 A | * | 8/1997 | Koh et al. | 365/201 |
| 5,657,282 A | * | 8/1997 | Lee | 365/201 |
| 6,226,764 B1 | * | 5/2001 | Lee | 714/718 |
| 6,501,692 B1 | * | 12/2002 | Melanson et al. | 365/201 |
| 6,611,146 B2 | * | 8/2003 | Montrose | 324/519 |
| 6,756,804 B2 | | 6/2004 | Ishibashi | |
| 6,930,504 B2 | * | 8/2005 | Ishibashi | 324/750.3 |
| 7,437,260 B2 | * | 10/2008 | Ausserlechner et al. | 702/107 |

FOREIGN PATENT DOCUMENTS

| | | |
|---|---|---|
| JP | 08-102184 | 4/1996 |
| JP | 2000-222892 | 8/2000 |
| KR | 100139571 | 3/1998 |

* cited by examiner

*Primary Examiner* — Lisa Caputo
*Assistant Examiner* — Octavia Davis
(74) *Attorney, Agent, or Firm* — F. Chau & Associates, LLC

(57) ABSTRACT

A stress detection circuit includes a function block and a detection signal generation circuit. The function block outputs a first voltage such that the first voltage is varied depending on an extent that the function block is stressed. The detection signal generation circuit generates a stress detection signal based on the first voltage and a second voltage during a test mode. The stress detection signal represents integration of the function block, and a level of the second voltage corresponds to a level of the first voltage before the function block is stressed.

18 Claims, 6 Drawing Sheets

| | DETp | DETn | STATUS |
|---|---|---|---|
| \| Spp-Snn \| < VRp-VRn | 0 | 0 | NORMAL |
| \| Spp-Snn \| > VRp-VRn | 0 | 1 | ABNORMAL |
| | 1 | 0 | |

| DETp3 | DETp2 | DETp1 | DETn1 | DETn2 | DETn3 | STATUS |
|---|---|---|---|---|---|---|
| 1 | 1 | 1 | 0 | 0 | 0 | FAIL |
| 0 | 1 | 1 | 0 | 0 | 0 | STRp2 |
| 0 | 0 | 1 | 0 | 0 | 0 | STRp1 |
| 0 | 0 | 0 | 0 | 0 | 0 | NORMAL |
| 0 | 0 | 0 | 1 | 0 | 0 | STRn1 |
| 0 | 0 | 0 | 1 | 1 | 0 | STRn2 |
| 0 | 0 | 0 | 1 | 1 | 1 | FAIL |

STRESS DETECTION CIRCUIT AND SEMICONDUCTOR CHIP INCLUDING SAME

CROSS-REFERENCE TO RELATED APPLICATION

This application claims priority under 35 USC §119 to Korean Patent Application No. 2007-0053583, filed on May 31, 2007, the disclosure of which is incorporated by reference herein.

BACKGROUND OF THE INVENTION

1. Technical Field

The present disclosure relates to measurement of stress in a semiconductor circuit, and more particularly to a stress detection circuit, a semiconductor circuit including the stress detection circuit, and a method of detecting stress in semiconductor circuits.

2. Discussion of the Related Art

As a scale of semiconductor devices is reduced, integration of semiconductor devices becomes more difficult. When a high voltage is applied between a gate and a body of a metal oxide semiconductor (MOS) transistor, a high electric field is formed in a dielectric film between the gate and the body. Also, the high electric field may be formed when the high voltage is applied between the source and the drain of a MOS transistor.

Defects may be caused in the dielectric film and the body of the MOS transistor due to the aforementioned high electric field, and these defects could change the characteristics of the MOS transistor such as a threshold voltage. Even when a transistor operates at a relatively low voltage, the characteristics such as the threshold voltage may be altered by repeated application of the voltage.

When transistor characteristics such as a threshold voltage are changed due to a high operation voltage or repeated application of a voltage, a transistor or a function block including the transistor is referred to as "being stressed" or "being degraded".

Figure 1:
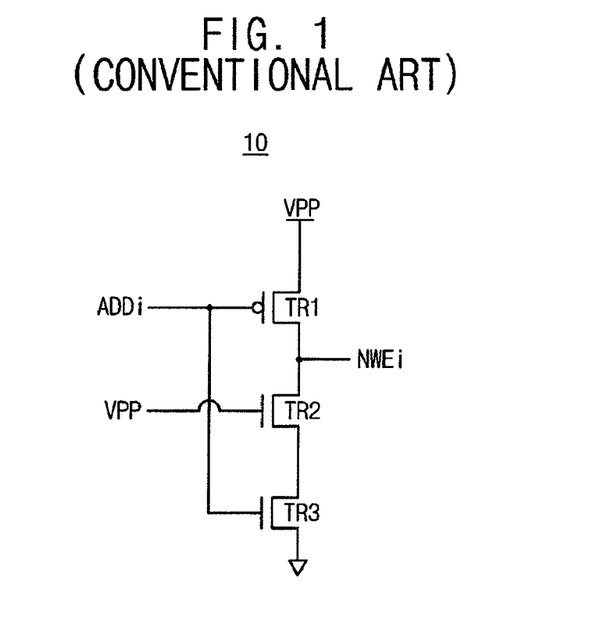
FIG. 1 is a circuit diagram illustrating an example of a function block in a semiconductor device.

FIG. 1 is a circuit diagram illustrating an example of a function block in a semiconductor device.

A function block 10 illustrated in FIG. 1 is an example of a driver included in a row selection circuit of a semiconductor memory device. The function block 10 includes transistors TR1, TR2, and TR3 serially coupled between a high voltage VPP and a ground voltage. The function block 10 generates a word line enable signal NWEi that is selectively activated in response to a bit signal ADDi and the high voltage VPP applied to gates of the transistors TR1, TR2, and TR3. The bit signal ADDi is a signal decoded from an address signal. When the word line enable signal NWEi is activated to near the high voltage VPP, a corresponding word line is enabled.

When the transistors TR1, TR2, and TR3 have been stressed by repeated application of the voltages, a level of the word line enable signal NWEi is decreased, and thus a memory cell transistor (not shown) coupled to the corresponding word line may not be fully turned on, thereby degrading the performance of the entire semiconductor memory device.

Since the performance of an entire system may be affected by variation of the characteristics of some function blocks due to such stress, the stress of the function blocks needs to be tested before and after the packaging of semiconductor chips. That is, after a semiconductor chip including a function block sensitive to stress is manufactured, a burn-in test is performed under high temperature, high voltage, and high pressure conditions for measuring variation of the characteristics of the semiconductor chip due to stress. Such burn-in test may cause additional and excessive stress on the semiconductor chip, thereby unnecessarily reducing the lifetime of the semiconductor chip.

SUMMARY OF THE INVENTION

Exemplary embodiments of the present invention seek to provide a stress detection circuit for measuring integration of a function block including a transistor.

Exemplary embodiments of the present invention seek to provide a semiconductor chip including the stress detection circuit.

Exemplary embodiments of the present invention seek to provide a method of detecting stress for measuring integration of a function block or a semiconductor chip including a transistor.

According to an exemplary embodiment of the present invention, a stress detection circuit includes a function block and a detection signal generation circuit. The function block outputs a first voltage such that the first voltage is varied depending on an extent that the function block is stressed. The detection signal generation circuit generates a stress detection signal based on the first voltage and a second voltage during a test mode, where the stress detection signal represents integration of the function block, and a level of the second voltage corresponds to a level of the first voltage before the function block is stressed.

The detection signal generation circuit may include a transistor having a gate for receiving an upper reference voltage and another transistor having another gate for receiving a lower reference voltage such that a difference between the upper reference voltage and the lower reference voltage corresponds to a reference value for determining whether the function block has failed.

The detection signal generation circuit may include a first detection unit configured to compare the reference value with the second voltage subtracted from the first voltage to generate a first bit of the stress detection signal, and a second detection unit configured to compare the reference value with the first voltage subtracted from the second voltage to generate a second bit of the stress detection signal.

Each of the first and second detection units may include current paths such that each current path generates a current in proportion to a sum of a first one of the first and second voltages and a second one of the upper and lower reference voltages.

Each of the first and second detection units may include a first current path, a second current path, a first current source, a second current source, and a comparator.

The first current path may include a first resistor, a first transistor, and a second transistor, such that the first resistor is coupled between a power supply voltage and a first node, and drains of the first and second transistors are commonly coupled to the first node. The second current path may include a second resistor, a third transistor and a fourth transistor, such that the second resistor is coupled between the power supply voltage and a second node, and drains of the third and fourth transistors are commonly coupled to the second node. The first current source is coupled between a first bias node and a ground voltage, and sources of the first and third transistors are commonly coupled to the first bias node. The second current source is coupled between a second bias node and the ground voltage, and sources of the second and fourth transistors are commonly coupled to the second bias node.

The comparator compares voltages at the first and second nodes to generate the first or second bit of the stress detection signal.

In the first detection unit, a gate of the first transistor receives the first voltage, a gate of the second transistor receives the lower reference voltage, a gate of the third transistor receives the second voltage, and a gate of the fourth transistor receives the upper reference voltage.

In the second detection unit, a gate of the first transistor receives the second voltage, a gate of the second transistor receives the lower reference voltage, a gate of the third transistor receives the first voltage, and a gate of the fourth transistor receives the upper reference voltage.

The detection signal generation circuit may include a plurality of transistors having gates for respectively receiving each of k upper reference voltages, where k is an integer greater than 1, and a plurality of transistors having gates for respectively receiving each of k lower reference voltages. Each difference between each upper reference voltage and each corresponding lower reference voltage respectively corresponds to each of k reference values for determining a stress level of the function block.

The detection signal generation circuit may include k first detection units configured to compare the reference values with the second voltage subtracted from the first voltage to generate k first bits of the stress detection signal, respectively, and k second detection units configured to compare the reference values with the first voltage subtracted from the second voltage to generate k second bits of the stress detection signal, respectively.

Each of the first and second detection units may include current paths, such that each current path generate a current in proportion to a sum of a first one of the first and second voltages and a second one of the upper and lower reference voltages, respectively.

The stress detection circuit may further include a reference block that is activated during the test mode to provide the second voltage. The reference block may include a dummy block having a configuration substantially identical to the function block, and a switching unit configured to pass an input signal during the test mode so that the dummy block outputs the second voltage and configured to block the input signal during a normal operation mode so that the dummy block is prevented from being stressed by the input signal.

A semiconductor chip may include input/output pins for transferring signals with an external device, a function block, a detection signal generation circuit, and an interface unit.

The function block outputs a first voltage and the first voltage varies in response to an extent that the function block is stressed. The detection signal generation circuit generates a stress detection signal based on the first voltage and a second voltage during a test mode, where the stress detection signal represents integration of the function block, and a level of the second voltage corresponds to a level of the first voltage before the function block is stressed. The interface unit outputs the stress detection signal during the test mode through at least one of the input/output pins.

The interface unit may include at least one multiplexer configured to select one of the stress detection signal and an output signal during a normal operation mode in response to a test mode signal, and configured to output the selected signal through the at least one of the input/output pins.

The detection signal generation circuit may include a transistor having a gate for receiving an upper reference voltage and another transistor having another gate for receiving a lower reference voltage, such that a difference between the upper reference voltage and the lower reference voltage corresponds to a reference value for determining whether the function block has failed.

The detection signal generation circuit may include a first detection unit configured to compare the reference value with the second voltage subtracted from the first voltage to generate a first bit of the stress detection signal, and a second detection unit configured to compare the reference value with the first voltage subtracted from the second voltage to generate a second bit of the stress detection signal.

Each of the first and second detection units may include current paths, such that each current path generates a current in proportion to a sum of a first one of the first and second voltages and a second one of the upper and lower reference voltages.

The detection signal generation circuit may include a plurality of transistors having gates for respectively receiving each of k upper reference voltages, where k is an integer greater than 1, and a plurality of transistors having gates for respectively receiving each of k lower reference voltages. Each difference between each upper reference voltage and each corresponding lower reference voltage respectively corresponds to each of k reference values for determining a stress level of the function block.

The detection signal generation circuit may include k first detection units configured to compare the reference values with the second voltage subtracted is 5 from the first voltage to generate k first bits of the stress detection signal, respectively, and k second detection units configured to compare the reference values with the first voltage subtracted from the second voltage to generate k second bits of the stress detection signal, respectively.

Each of the first and second detection units may include current paths, such that each current path generates a current in proportion to a sum of a first one of the first and second voltages and a second one of the upper and lower reference voltages, respectively.

The semiconductor chip may further include a reference block that is activated during the test mode to provide the second voltage. The reference block may include a dummy block having a configuration substantially identical to the function block, and a switching unit configured to pass an input signal during the test mode so that the dummy block output the second voltage and configured to block the input signal during a normal operation mode so that the dummy block is prevented from being stressed by the input signal.

DETAILED DESCRIPTION OF EXEMPLARY EMBODIMENTS

Exemplary embodiments of the present invention will be described in detail with reference to the accompanying drawings. Like reference numerals refer to like elements throughout the disclosure.

It will be understood that when an element is referred to as being "connected" or "coupled" to another element, it can be directly connected or coupled to the other element or intervening elements may be present.

Figure 2:
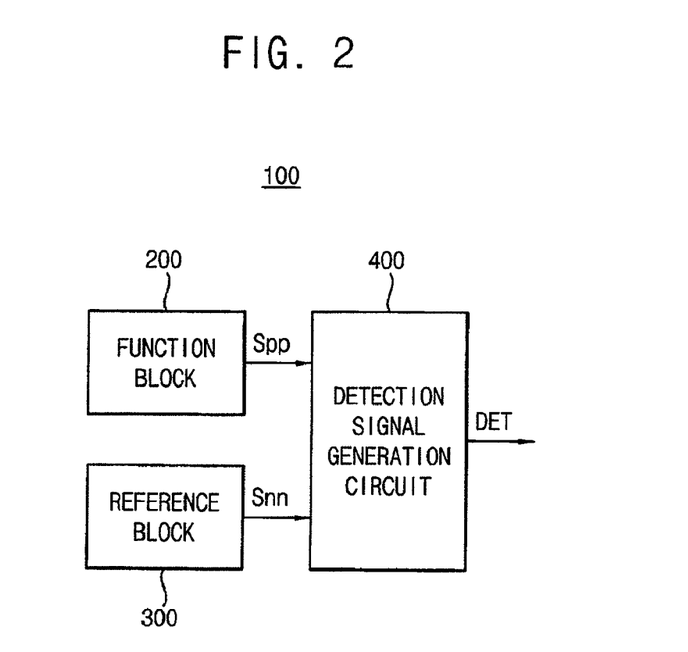
FIG. 2 is a block diagram illustrating a stress detection circuit according to an exemplary embodiment of the present invention.

FIG. 2 is a block diagram illustrating a stress detection circuit according to an exemplary embodiment of the present invention.

Referring to FIG. 2, a stress detection circuit 100 includes a function block 200 and detection signal generation circuit 400. The stress detection circuit 100 may further include a reference block 300 for providing a second voltage Snn.

The function block 200 includes one or more transistors (not shown) that are stressed or degraded by repeated application of an operation voltage. The function block 200 outputs a first voltage Spp that varies depending on an extent that the function block 200 is stressed. The detection signal generation circuit 400 generates a stress detection signal DET based on the first voltage Spp and the second voltage Snn during a test mode. The stress detection signal DET represents integration of the function block, and a level of the second voltage Snn corresponds to a level of the first voltage before the function block 200 is stressed. The function block 200 may be an arbitrary circuit for performing its own function in an integrated circuit or a semiconductor chip. Particularly, the function block 200 may be a portion of the integrated circuit, which is sensitive to stress and thus its integration directly affects the performance of the entire semiconductor chip.

The test mode may be performed during initializing processes when the function block 200 is powered on, or may be performed periodically between normal operations of the function block 200. Alternatively, the test mode may be performed non-periodically in response to a specific command.

The second voltage Snn is set to a level corresponding to the first voltage Spp output by the unstressed function block 200. For example, the second voltage Snn may be determined through experimental measurements, and thus may be provided as a fixed value using a voltage divider circuit including a plurality of resistors. Alternatively, the stress detection circuit 100 may further include the reference block 300 for providing the second voltage Snn as illustrated in FIG. 2. The reference block 300 may have a configuration substantially identical to the function block 200, and may be activated during the test mode so that the reference block 300 may not be stressed during the normal operation mode.

Figure 3:
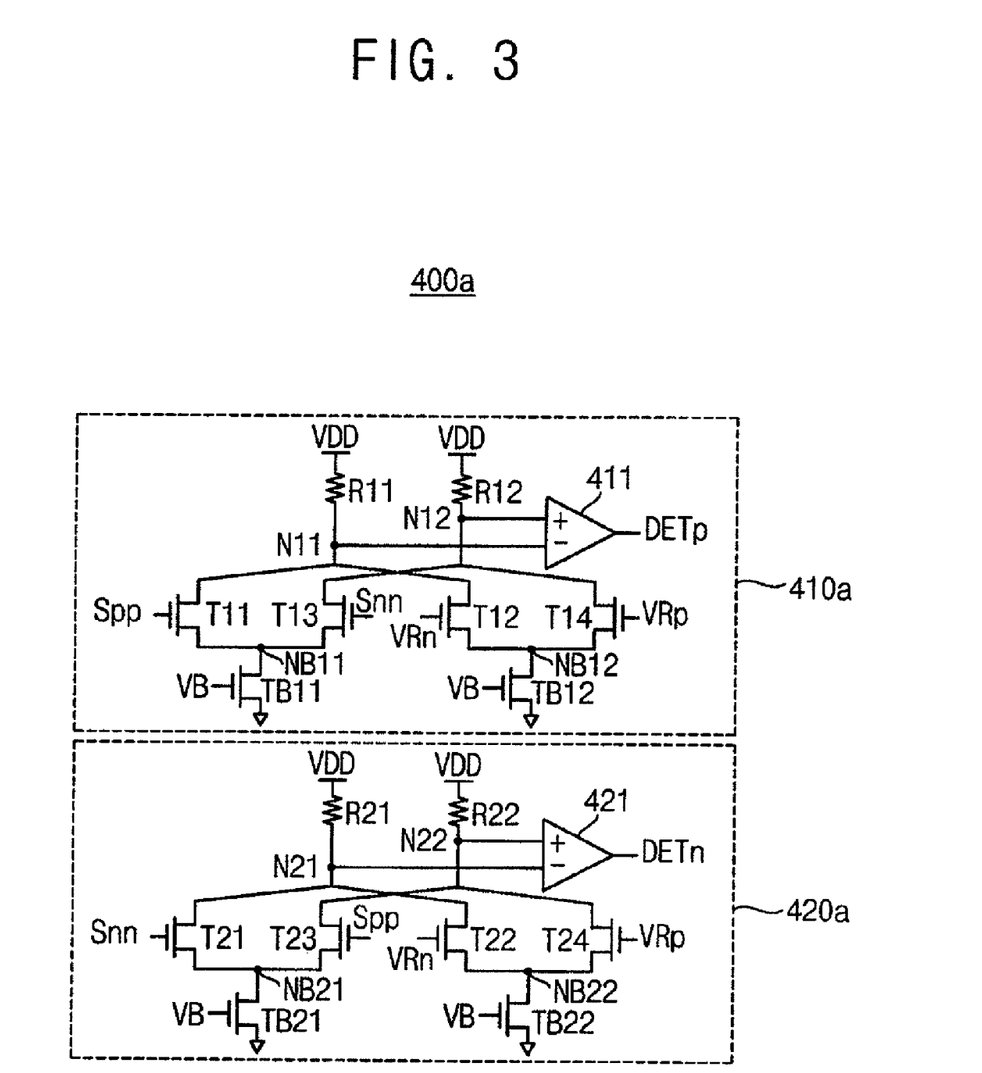
FIG. 3 is a circuit diagram illustrating an example of a detection signal generation circuit in the stress detection circuit of FIG. 2.

FIG. 3 is a circuit diagram illustrating an example of a detection signal generation circuit in the stress detection circuit of FIG. 2.

As illustrated in FIG. 3, the detection signal generation circuit 400a may include one or more transistors T12 and T22 having a gate for receiving an upper reference voltage VRp, and one or more transistors T14 and T24 having a gate for receiving a lower reference voltage VRn. A difference VRp−VRn between the upper reference voltage VRp and the lower reference voltage VRn corresponds to a reference value for determining whether or not the function block has failed.

Referring to FIG. 3, the detection signal generation circuit 400a may include a first detection unit 410a and a second detection unit 420a.

The first detection unit 410a compares the reference value VRp−VRn with a subtracted value Spp−Snn corresponding to the second voltage Snn subtracted from the first voltage Spp to generate a first bit DETP of the stress detection signal DET. The second detection unit 420a compares the reference value VRp−VRn with a subtracted value Snn−Snn corresponding to the first voltage Spp subtracted from the second voltage Snn to generate a second bit DETn of the stress detection signal DET.

Each of the first and second detection units may include current paths such that each current path generates a current in proportion to a sum of one of the first and second voltages Spp and Snn and one of the upper and lower reference voltages VRp and VRn.

The first detection unit 410a may include a first current path, a second current path, a first current source TB11, a second current source TB12, and a comparator 411.

The first current path includes a first resistor R11, a first transistor T11, and a second transistor T12. The first resistor R11 is coupled between a power supply voltage VDD and a first node N11, and drains of the first and second transistors T11 and T12 are commonly coupled to the first node N11. The second current path includes a second resistor R12, a third transistor T13, and a fourth transistor T14. The second resistor R12 is coupled between the power supply voltage VDD and a second node N12, and drains of the third and fourth transistors T13 and T14 are commonly coupled to the second node N12.

The first current source TB1 is coupled between a first bias node NB11 and a ground voltage. Sources of the first and third transistors T11 and T13 are commonly coupled to the first bias node TB11. The first current source TB1 provides a current based on a bias voltage VB so that the first current source TB1 maintains the total current flowing through the first and third transistors TB11 and TB13. The second current source TB12 is coupled between a second bias node TB12 and the ground voltage. Sources of the second and fourth transistors T12 and T14 are commonly coupled to the second bias node TB12. The second current source TB2 provides a current based on the bias voltage VB so that the second current source TB2 maintains the total current flowing through the second and fourth transistors TB12 and TB14.

The comparator 411 compares voltages at the first and second nodes N11 and N12 to generate the first bit DETp of the stress detection signal DET The configuration of the second detection unit 420a is similar to that of the first detection unit 410a, and thus a detailed description is omitted. Comparing the second detection unit 420a with the first detection unit 410a, the combination of signals applied to the first through fourth transistors T21, T22, T23, and T24 of the second detection unit 420a is different from the combination of signals applied to the first through fourth transistors T11, T12, T13, and T14 of the first detection unit 410a as illustrated in FIG. 3.

In the first detection unit 410a, the first voltage Spp and the lower reference voltage VRn are respectively applied to the gates of the first and second transistors T11 and T12, and the second voltage Snn and the upper reference voltage VRp are respectively applied to the gates of the third and fourth transistors T13 and T14, Accordingly, a first current flowing through the first resistor R11 is proportional to a summed value Spp+VRn, and a second current flowing through the second resistor R12 is proportional to a summed value Snn+VRp. The voltage at the first node Ni1 corresponds to a voltage dropped by the first current times a resistance of the first resistor R11, and the voltage at the second node N12 corresponds to a voltage dropped by the second current times a resistance of the second resistor R12.

As a result, the comparator 411 in the first detection unit 410a performs a comparison operation as described in Expression 1, and generates the first bit DETP having logic high or low according to the comparison result.

$$Spp+VRn<Snn+VRp, \text{ or } Spp-Snn<VRp-VRn \quad \text{Expression 1}$$

In the second detection unit 420a, the second voltage Snn and the lower reference voltage VRn are respectively applied to the gates of the first and second transistors T21 and T22, and the first voltage Spp and the upper reference voltage VRp are respectively applied to the gates of the third and fourth transistors T23 and T24. Accordingly, a first current flowing through the first resistor R21 is proportional to a summed value Snn+VRn, and a second current flowing through the second resistor R22 is proportional to a summed value Spp+VRp. The voltage at the first node N21 corresponds to a voltage dropped by the first current multiplied by a resistance of the first resistor R21, and the voltage at the second node N22 corresponds to a voltage dropped by the second current multiplied by a resistance of the second resistor R22.

As a result, the comparator 421 in the second detection unit 420a performs a comparison operation as described in Expression 2, and generates the second bit DETn having logic high or low according to the comparison result.

$$Snn+VRn<Spp+VRp, \text{ or } -(Spp-Snn)<VRp-VRn \quad \text{Expression 2}$$

Accordingly, the comparators 411 and 421 in the detection signal generation circuit 400a perform a comparison operation as described in Expression 3, and the detection signal generation circuit 400a generates the stress detection signal DET including the first and second bits DETp and DETn.

$$|Spp-Snn|<VRp-VRn \quad \text{Expression 3}$$

The combination of the first and second bits DETp and DETn represents whether the function block 200 has failed or not.

Figure 4:
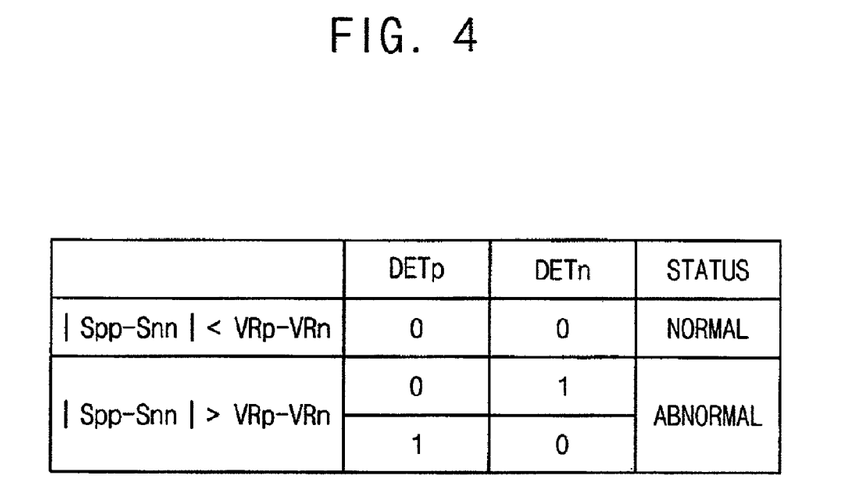
FIG. 4 is a diagram illustrating outputs of the detection signal generation circuit of FIG. 3.

FIG. 4 is a diagram illustrating outputs of the detection signal generation circuit of FIG. 3.

Referring to FIG. 4, both of the first and second bits DETp and DETn correspond to a first logic value (e.g., logic low '0') when the absolute difference |Spp-Snn| is lower than the reference value VRp-VRn, where the first voltage Spp corresponds to a stressed status of the function block 200 and the second voltage Snn corresponds to an unstressed status of the function block 200.

When the absolute difference |Spp-Snn| is greater than the reference value VRp-VRn, one of the first and second bits DETP and DETn corresponds to the first logic value, and the other of the first and second bits DETp and DETn corresponds to a second logic value (e.g., logic high '1').

As such, in the stress detection circuit 100 including the detection signal generation circuit 410a, the function block 200 is determined to be in a normal status when the first and second bits DETp and DETn have the first logic value. On the contrary, the function block 200 is determined to be in an abnormal status or to have failed when one of the first and second bits DETp and DETn has the second logic value.

Figure 5:
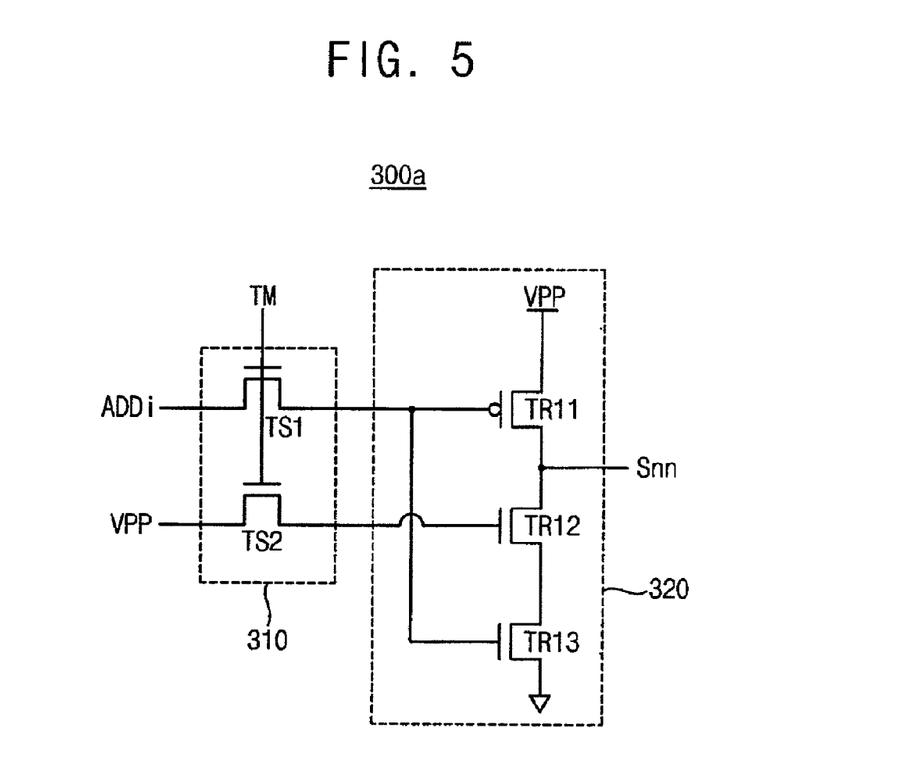
FIG. 5 is a circuit diagram illustrating an example of a reference block in the stress detection circuit of FIG. 2.

FIG. 5 is a circuit diagram illustrating an example of the reference block in the stress detection circuit of FIG. 2.

As described with respect to FIG. 2, the stress detection circuit 100 may further include the reference block 300 that is activated in the test mode for generating the second voltage Snn corresponding to the first voltage Spp of the unstressed function block 200.

Referring to FIG. 5, a reference block 300a may include a switching unit 310 and a dummy block 320.

The dummy block has a configuration substantially identical to the function block 200, and provides the second voltage Snn during the test mode. The dummy block 320 in FIG. 5 is an example corresponding to the function block in FIG. 1, and the configuration of the dummy block 320 may be changed according to the respective function block.

The switching unit 310 passes input signals ADDi and VPP during the test mode so that the dummy block 320 outputs the second voltage Snn, and blocks the input signals during the normal operation mode so that the dummy block is prevented from being stressed by the input signal ADDi and VPP.

The switch unit 310 may be implemented with switching elements TS1 and TS2 for intercepting the input signals ADDi and VPP applied to the gates of the transistors TR11, TR12, and TR13 in the dummy block 320. The switching elements may be implemented with MOS transistors TS1 and TS2 operating in response to a test mode signal TM. The transistor TS1 for intercepting the signal ADDi having a relatively low voltage level may be omitted in some exemplary embodiments. Further, additional switching elements may be included in the dummy block 320 to separate or float the transistors TR11, TR12, and TR13 from a ground voltage and a power supply voltage (e.g. the high voltage VPP) during the normal operation mode.

Figure 6:
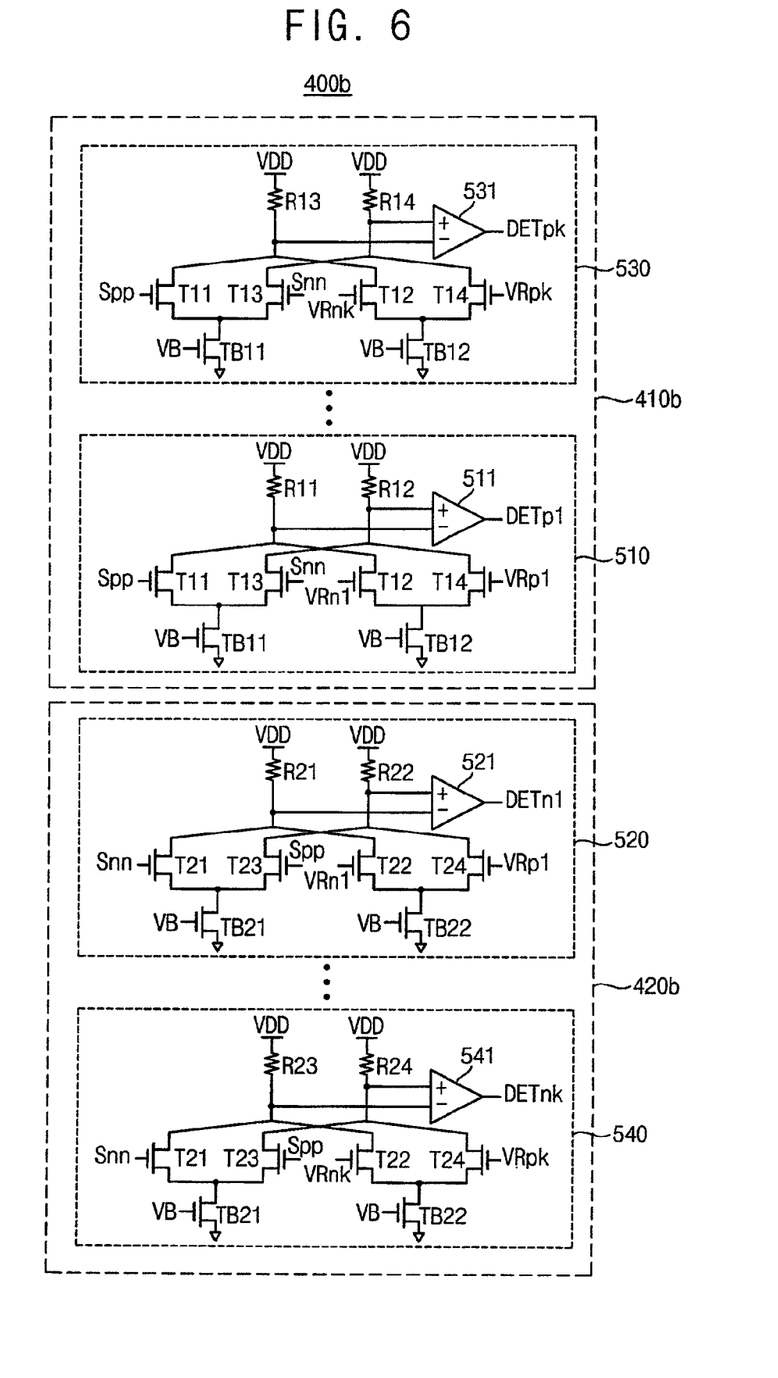
FIG. 6 is a circuit diagram illustrating another example of a detection signal generation circuit in the stress detection circuit of FIG. 2.

FIG. 6 is a circuit diagram illustrating another example of a detection signal generation circuit in the stress detection circuit of FIG. 2.

As illustrated in FIG. 6, the stress detection circuit 400b may include a plurality of transistors T12 and T22 having gates for respectively receiving each of k upper reference voltages VRp1 through VRpk, where k is an integer greater than 1, and a plurality of transistors T14 and T24 having gates for respectively receiving each of k lower reference voltages VRn1 through VRnk. Each of differences VRp1-VRn1 through VRpk-VRnk between each corresponding upper reference voltage and each corresponding lower reference voltage, respectively, corresponds to each of k reference values for determining a stress level of the function block 200.

Referring to FIG. 6, the detection signal generation circuit 400b may include k first detection units 41b and k second detection units 420b.

The k first detection units 410b compare the reference values Vrpi-Vrni (I=1, 2, . . . , k) with a subtracted value Spp-Snn corresponding to the second voltage Snn subtracted from the first voltage Spp to generate k first bits DETpi of the stress detection signal DET, respectively. The k second detection units 420b compare the reference values Vrpi-Vrni with a subtracted value Snn-Snn corresponding to the first voltage Spp subtracted from the second voltage Snn to generate k second bits DETni of the stress detection signal DET, respectively.

Each of the first detection units 510 and 530 and each of the second detection units 520 and 540 includes current paths such that each current path generates a current in proportion to a sum of one of the first and second voltages Spp and Snn and one of the upper and lower reference voltages VRpi and VRni, respectively.

The configurations of the first detection units 510 and 530 and the second detection units 520 and 540 are similar to those of the first detection unit 410a and the second detection unit 420a in FIG. 3, and thus a detailed description is omitted. As illustrated in FIG. 6, the k first detection units 410b and the k second detection units 420b are related with the respective reference values VRpi–VRni. For example, the reference values VRpi–VRni may be set to sequentially increased values.

Accordingly the comparators 511 and 531 in the first detection units 410b and the comparators 521 and 541 in the second detection units 420b perform a comparison operation as described in Expression 4, respectively.

$$|Spp-Snn| < VRpi-VRni \ (i=1, 2, \ldots, k) \qquad \text{Expression 4}$$

The combination of the first and second bits DETpi and DETni represents the stress level of the function block 200.

Figure 7:
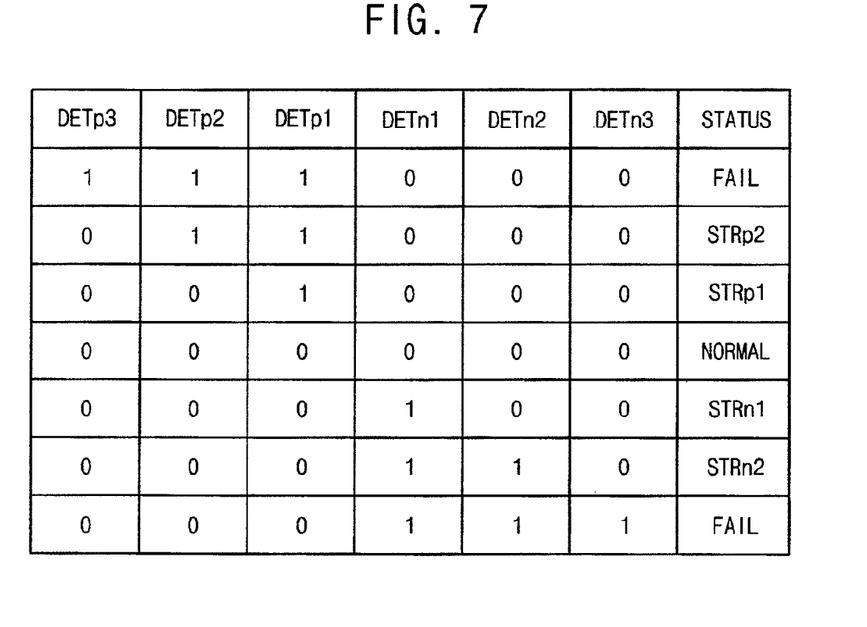
FIG. 7 is a diagram illustrating outputs of the detection signal generation circuit of FIG. 6.

FIG. 7 is a diagram illustrating outputs of the detection signal generation circuit of FIG. 6. For convenience of description, an example is illustrated in FIG. 7 wherein the stress detection signal DET includes three first bits DETp1, DETp2, and DETp3 and three second bits DETn1, DETn2, and DETn3.

Referring to FIG. 7, all of the first and second bits correspond to a first is 5 logic value (e.g., logic low '0') when the absolute difference |Spp–Snn| is lower than the first reference value VRp1|VRn1 (that is, NORMAL), where the first voltage Spp corresponds to a stressed status of the function block 200 and the second voltage Snn corresponds to an unstressed status of the function block 200.

When the absolute difference |Spp–Snn| is greater than the first reference value VRp1–VRn1 and smaller than the second reference value VRp2–VRn2 (that is, STRp1 or STRn1), the one first bit DETp1 or the one second bits DETn1 corresponds to the first logic value, and the other first and second bits correspond to a second logic value (e.g., logic high '1').

When the absolute difference |Spp–Snn| is greater than the second reference value VRp2–VRn2 and smaller than the third reference value VRp3–VRn3 (that is, STRp2 or STRn2), the two first bits DETp1 and DETp2 or the two second bits DETn1 and DETn2 correspond to the first logic value, and the other first and second bits correspond to the second logic value.

When the absolute difference |Spp–Snn| is greater than the third reference value VRp3–VRn3 (that is, FAIL), all the three first bits DETp3, DETp2, and DETp1 correspond to the second logic value, or all the three first bits DETn1, DETn2, and DETn3 correspond to the second logic value.

As such, the stress detection circuit 100 including the detection signal generation circuit 410b may determine whether the function block 200 and/or a semiconductor chip including the function block 200 has failed or not based on the combination of the first and second bits of the stress detection signal DET. Further, the stress level of the function block 200 may be determined as the distinct status STRp1, STRp2, STRn1 and STRn2, and thus the remaining lifetime of the function block 200 can be anticipated.

Figure 8:
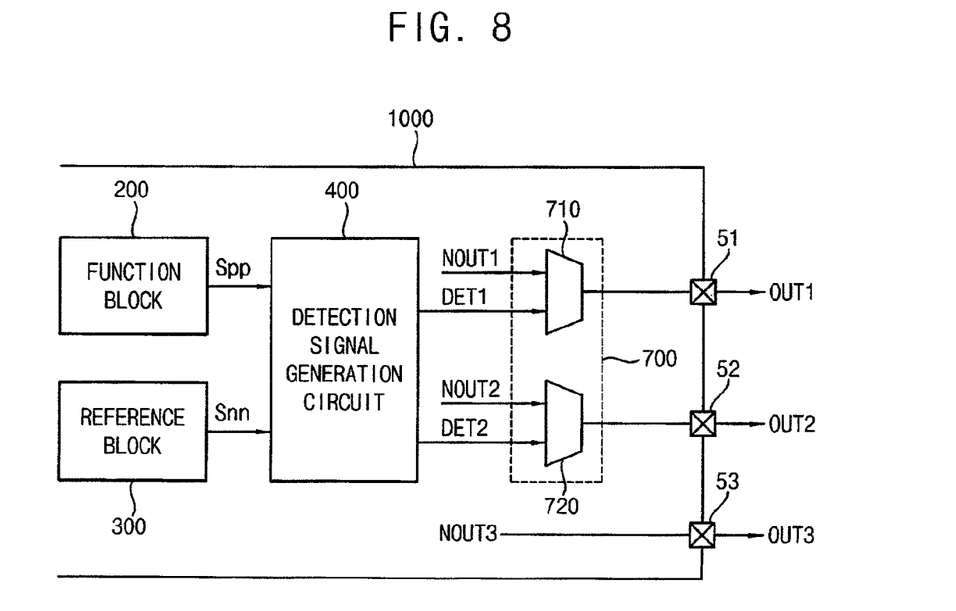
FIG. 8 is a diagram illustrating a semiconductor chip according to an exemplary embodiment of the present invention.

FIG. 8 is a diagram illustrating a semiconductor chip according to an exemplary embodiment of the present invention.

Referring to FIG. 8, a semiconductor chip 1000 includes input/output pins 51, 52, and 53 for transferring signals with an external device, a function block 200, a detection signal generation circuit 400, and an interface unit 700. The semiconductor chip 1000 may further include a reference block 300 for providing a second voltage Snn. The function block 200, the reference block 300, and the detection signal generation circuit 400 are implemented as described above with reference to FIGS. 2 through 7, and thus the description thereof is omitted.

The interface unit 700 may be configured to output the stress detection signals DET1 and DET2 during the test mode through at least one of the input/output pins 51, 52 and 53. For example, the interface unit 700 may include one or more multiplexers 710 and 720 that receive output signals NOUT1 and NOUT2 in the normal operation mode and the stress detection signals DET1 and DET2. The multiplexers 710 and 720 select the output signals NOUT1 and NOUT2 or the stress detection signals DET1 and DET2 in response to a test mode signal indicating the operation mode of the semiconductor chip 1000, and the selected output signals OUT1 and OUT2 are transferred to the external device through the pins 51 and 52. At least one output signal NOUT3 may be transferred through the pin 53 regardless of the operation mode.

The number of multiplexers and the pins coupled to the multiplexers may be changed. The interface unit 700 may include a serializer for sequentially outputting a plurality of bits of the stress detection signal DET.

Figure 9:
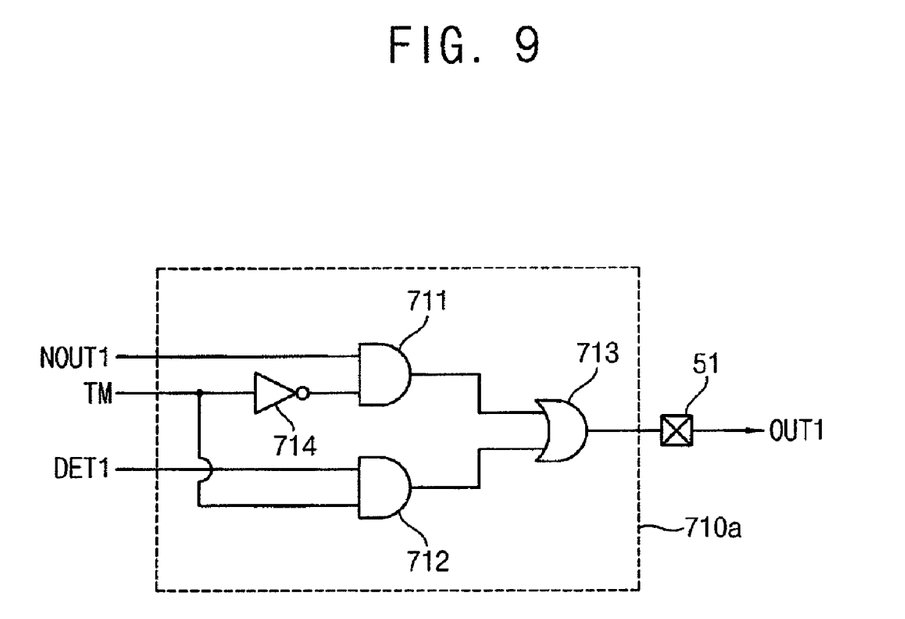
FIG. 9 is a circuit diagram illustrating a multiplexer in the semiconductor chip of FIG. 8.

FIG. 9 is a circuit diagram illustrating a multiplexer in the semiconductor chip of FIG. 8.

Referring to FIG. 9, a multiplexer 710a may include a first AND logic gate 711, a second AND logic gate 712, an OR logic gate 713, and an inverter 714.

When the test mode signal TM is activated to logic high, the first AND logic gate 711 outputs a logic low regardless of the output signal NOUT1 of the normal operation mode, and the second AND logic gate 712 outputs the logic level of the stress detection signal DET1. Accordingly, the OR logic gate 713 outputs the logic level of the stress detection signal DET1 as the selected output signal OUT1 during the test mode.

When the test mode signal TM is deactivated to a logic low, the second AND logic gate 712 outputs a logic low regardless of the stress detection signal DET1, and the first AND logic gate 711 outputs the logic level of the output signal NOUT1 of the normal operation mode. Accordingly, the OR logic gate 713 outputs the logic level of the output signal NOUT1 as the selected output signal OUT1 during the normal operation mode.

The configuration of the multiplexer may be changed as long as the multiplexer selectively outputs the output signal NOUT1 of the normal operation mode or the stress detection signal DET1 of the test mode.

While exemplary embodiments of the present invention have been described in detail herein, it should be understood that various changes, substitutions, and alterations may be made without departing from the scope of the disclosure.

What is claimed is:

1. A stress detection circuit comprising:
   a function block that outputs a first voltage, the first voltage varying in response to an extent that the function block is stressed;
   a reference block that is activated during a test mode to provide a second voltage, a level of the second voltage corresponding to a level of the first voltage before the function block is stressed; and
   a detection signal generation circuit configured to generate a stress result detection signal based upon the first voltage output from the function block and the second voltage output from the reference block during the test mode, wherein the detection signal generation circuit includes a transistor having a gate for receiving an upper reference voltage and another transistor having another gate for receiving a lower reference voltage, a different between the upper reference voltage and the lower reference voltage corresponding to a reference value for determining whether the function block has failed.

2. The stress detection circuit of claim 1 wherein the detection signal generation circuit comprises:
   a first detection unit configured to compare the reference value with the second voltage subtracted from the first voltage to generate a first bit of the stress detection signal; and
   a second detection unit configured to compare the reference value with the first voltage subtracted from the second voltage to generate a second hit of the stress detection signal.

3. The stress detection circuit of claim 2, wherein each of the first and second detection units comprises:
   current paths, each current path for generating a current in proportion to a sum of a first one of the first and second voltages and a second one of the upper and lower reference voltages.

4. The stress detection circuit of claim 2, wherein each of the first and second detection units comprises:
   a first current path including a first resistor, a first transistor, and a second transistor, the first resistor being coupled between a power supply voltage and a first node, drains of the first and second transistors being commonly coupled to the first node;
   a second current path including a second resistor, a third transistor and a fourth transistor, the second resistor being coupled between the power supply voltage and second node, drains of the third and fourth transistors being commonly coupled to the second node;
   a first current source coupled between a first bias node and a ground voltage, sources of the first and third transistors being commonly coupled to the first bias node;
   a second current source coupled between a second bias node and the ground voltage, sources of the second and fourth transistors being commonly coupled to the second bias node; and
   a comparator configured to compare voltages at the first and second nodes to generate One of the first or second bit of the stress detect signal.

5. The stress detection circuit of claim 4, wherein in the first detection unit, a gate of the first transistor receives first voltage, a gate of the second transistor receives the lower reference voltage, a gate of the transistor receives the second voltage, and a gate of the fourth transistor receives the upper reference voltage; and a
   wherein in the second detection unit, a gate of the first transistor receives the second voltage, a gate of second transistor receives lower reference voltage, a gate of the third transistor receives the first voltage, and a gate of the fourth transistor receives the upper reference voltage.

6. A stress detection circuit comprising:
   a function block that outputs a first voltage, the first voltage varying in response to an extent that the function block is stressed;
   a reference block that is activated during a test mode to provide a second voltage, a level of the second voltage corresponding to a level of the first voltage before the function block is stressed; and
   a detection signal generation circuit configured to generate a stress result detection signal based upon the first voltage output from the function block and the second voltage output from the reference block during the test mode, wherein the detection signal generation circuit includes a plurality of transistors having gates for respectively receiving each of k upper reference voltages, where k is an integer greater than 1, and a plurality of transistors having gates for respectively receiving each k lower reference voltages, each difference between each upper reference voltage and each corresponding lower reference voltage respectively corresponding to each of k reference values for determining a stress level of the function block.

7. The stress detection circuit of claim 6, wherein the detection signal generation circuit further comprises:
   k first detection units configured to compare the reference values with the second voltage subtracted from the first voltage to generate k first bits of the stress detection signal, respectively; and
   k second detection units configured to compare the reference values with the first voltage subtracted from the second voltage to generate k second bits of the stress detection signal, respectively.

8. The stress detection circuit of claim 7, wherein each of the first and second detection units comprises:
   current paths, each current path fur generating a current in proportion to a sum of a first one of the first and second voltages and a second one of the upper and lower reference voltages, respectively.

9. A stress detection circuit comprising:
   a function block that outputs a first voltage, the first voltage varying in response to an extent that the function block is stressed;
   a reference block that is activated during a test mode to provide a second voltage, a level of the second voltage corresponding to a level of the first voltage before the function block is stressed; and
   a detection signal generation circuit configured to generate a stress result detection signal based upon the first voltage output from the function block and the second voltage output from the reference block during the test mode, wherein the reference block comprises:
   a dummy block having a configuration substantially identical to the function block; and
   a switching unit configured to pass an input signal during test mode so that the dummy block outputs the second voltage and configured to block the input signal during a normal operation mode that the dummy block is prevented from being stressed by the input signal.

10. A semiconductor chip comprising:
   input/output pins for transferring signals with an external device;
   a function block that outputs a first voltage, the first voltage varying in response to an extent that the function block is stressed;
   a reference block that is activated during a test mode to provide a second voltage, a level of the second voltage corresponding to a level of the first voltage before the function block is stressed;
   detection signal generation circuit configured to generate a stress result detection signal based upon the first voltage output from the function block and the second voltage output form the reference block during the test mode; and
   an interface unit configured to output the stress result detection signal during the test mode through at least one of the input/output pins.

11. The semiconductor chip of claim 10, wherein the interface unit comprises:
   at least one multiplexer configured to select one of the stress detection signal and an output signal during a normal operation mode in response to a test mode signal, and configured to output the selected signal through the at least one of the input/output pins.

12. The semiconductor chip of claim 10, wherein the detection signal generation circuit includes a transistor having a gate for receiving an upper reference voltage and another transistor having another gate for receiving a lower reference voltage, a difference between the upper reference voltage and the lower reference voltage corresponding to a reference value for determining whether the function block has failed.

13. The semiconductor chip of claim 12, wherein the detection signal generation circuit comprises:
   a first detection unit configured to compare the reference value with the second voltage subtracted from the first voltage to generate a first bit of the stress detection signal; and
   a second detection unit configured to compare the reference value with the first voltage subtracted from the second voltage to generate a second bit of the stress detection signal.

14. The semiconductor chip of claim 13, wherein each of the first and second detection units comprises:
   current paths, each current path for generating a current in proportion to a sum of a first one of the first and second voltages and a second one of the upper and lower reference voltages.

15. The semiconductor chip of claim 10, wherein the detection signal generation circuit includes a plurality of transistors having gates for respectively receiving each of k upper reference voltages, where k is an integer greater than 1, and a plurality of transistors having gates for respectively receiving each of k lower reference voltages, each difference between each upper reference voltage and each corresponding lower reference voltage respectively corresponding to each of k reference values for determining a stress level of the function block.

16. The semiconductor chip of claim 15, wherein the detection signal generation circuit further comprises:
   k first detection units configured to compare the reference values with the second voltage subtracted from the first voltage to generate k first bits of the stress detection signal, respectively; and
   k second detection units configured to compare the reference values with the first voltage subtracted from the second voltage to generate k second bits of the stress detection signal, respectively.

17. The semiconductor chip of claim 16, wherein each of the first and second detection units comprises:
   current paths, each current path for generating a current in proportion to a sum of a first one of the first and second voltages and a second one of the upper and lower reference voltages, respectively.

18. The semiconductor chip of claim 10, wherein the reference block comprises:
   a dummy block having a configuration substantially identical to the function block; and
   a switching unit configured to pass an input signal during the test mode so that the dummy block output the second voltage and configured to block the input signal during a normal operation mode so that the dummy block is prevented from being stressed by the input signal.

* * * * *